s010147477B2

United States Patent
Kondo

(10) Patent No.: US 10,147,477 B2
(45) Date of Patent: *Dec. 4, 2018

(54) SYSTEM, METHOD, AND CONTROLLER FOR SUPPLYING ADDRESS AND COMMAND SIGNALS AFTER A CHIP SELECT SIGNAL

(71) Applicant: LONGITUDE SEMICONDUCTOR S.A.R.L., Luxembourg (LU)

(72) Inventor: Chikara Kondo, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/875,574

(22) Filed: Jan. 19, 2018

(65) Prior Publication Data

US 2018/0144784 A1    May 24, 2018

Related U.S. Application Data

(63) Continuation of application No. 15/403,513, filed on Jan. 11, 2017, now Pat. No. 9,886,994, which is a
(Continued)

(30) Foreign Application Priority Data

Sep. 28, 2011  (JP) ................................ 2011-212142

(51) Int. Cl.
| | | |
|---|---|---|
| *G11C 7/00* | (2006.01) | |
| *G11C 11/4076* | (2006.01) | |
| *G11C 7/10* | (2006.01) | |
| *G11C 7/22* | (2006.01) | |
| *G11C 8/18* | (2006.01) | |

(Continued)

(52) U.S. Cl.
CPC ........ *G11C 11/4076* (2013.01); *G11C 7/1039* (2013.01); *G11C 7/22* (2013.01); *G11C 8/18* (2013.01); *G11C 11/408* (2013.01); *G11C 11/4085* (2013.01); *G11C 11/4087* (2013.01);
(Continued)

(58) Field of Classification Search
CPC .......... G11C 8/18; G11C 7/22; G11C 7/1039; G11C 11/4076; G11C 11/408; G11C 11/4093; G11C 11/4087; G11C 11/4096
USPC ........... 365/191, 193, 230.06, 233.1, 233.12, 365/233.18, 230.08
See application file for complete search history.

(56) References Cited

U.S. PATENT DOCUMENTS

| | | | | |
|---|---|---|---|---|
| 6,088,291 | A * | 7/2000 | Fujioka .................... | G11C 7/06 365/230.08 |
| 8,743,652 | B2 * | 6/2014 | Kondo ..................... | G11C 8/18 365/191 |

(Continued)

*Primary Examiner* — Gene Auduong
(74) *Attorney, Agent, or Firm* — Kunzler, PC

(57) ABSTRACT

One controller for controlling operation of a memory device includes an output circuit configured to supply a chip select signal, an address signal, a command signal, and a clock signal to the memory device, and a data processing circuit configured to process read data and write data through a data terminal based on the chip select signal, the address signal, the command signal, and the clock signal supplied by the output circuit. The controller is configured to supply the address signal and the command signal to the memory device a predetermined duration after the output circuit supplies the chip select signal.

20 Claims, 7 Drawing Sheets

Related U.S. Application Data continuation of application No. 15/229,417, filed on Aug. 5, 2016, now Pat. No. 9,576,639, which is a continuation of application No. 14/733,924, filed on Jun. 8, 2015, now Pat. No. 9,455,019, which is a continuation of application No. 14/268,827, filed on May 2, 2014, now Pat. No. 9,053,775, which is a continuation of application No. 13/615,430, filed on Sep. 13, 2012, now Pat. No. 8,743,652.

(51) Int. Cl.
*G11C 11/408* (2006.01)
*G11C 11/4093* (2006.01)
*G11C 11/4096* (2006.01)
*G11C 11/4091* (2006.01)

(52) U.S. Cl.
CPC ...... *G11C 11/4091* (2013.01); *G11C 11/4093* (2013.01); *G11C 11/4096* (2013.01)

(56) References Cited

U.S. PATENT DOCUMENTS

| | | | |
|---|---|---|---|
| 8,767,502 B2* | 7/2014 | Kondo | G11C 7/24 365/191 |
| 9,053,775 B2* | 6/2015 | Kondo | G11C 8/18 |
| 9,455,019 B2* | 9/2016 | Kondo | G11C 8/18 |
| 9,576,639 B2* | 2/2017 | Kondo | G11C 8/18 |
| 9,837,137 B2* | 12/2017 | Saito | G11C 11/40615 |
| 9,886,994 B2* | 2/2018 | Kondo | G11C 11/4076 |
| 2013/0028034 A1* | 1/2013 | Fujisawa | G11C 11/40615 365/194 |

* cited by examiner

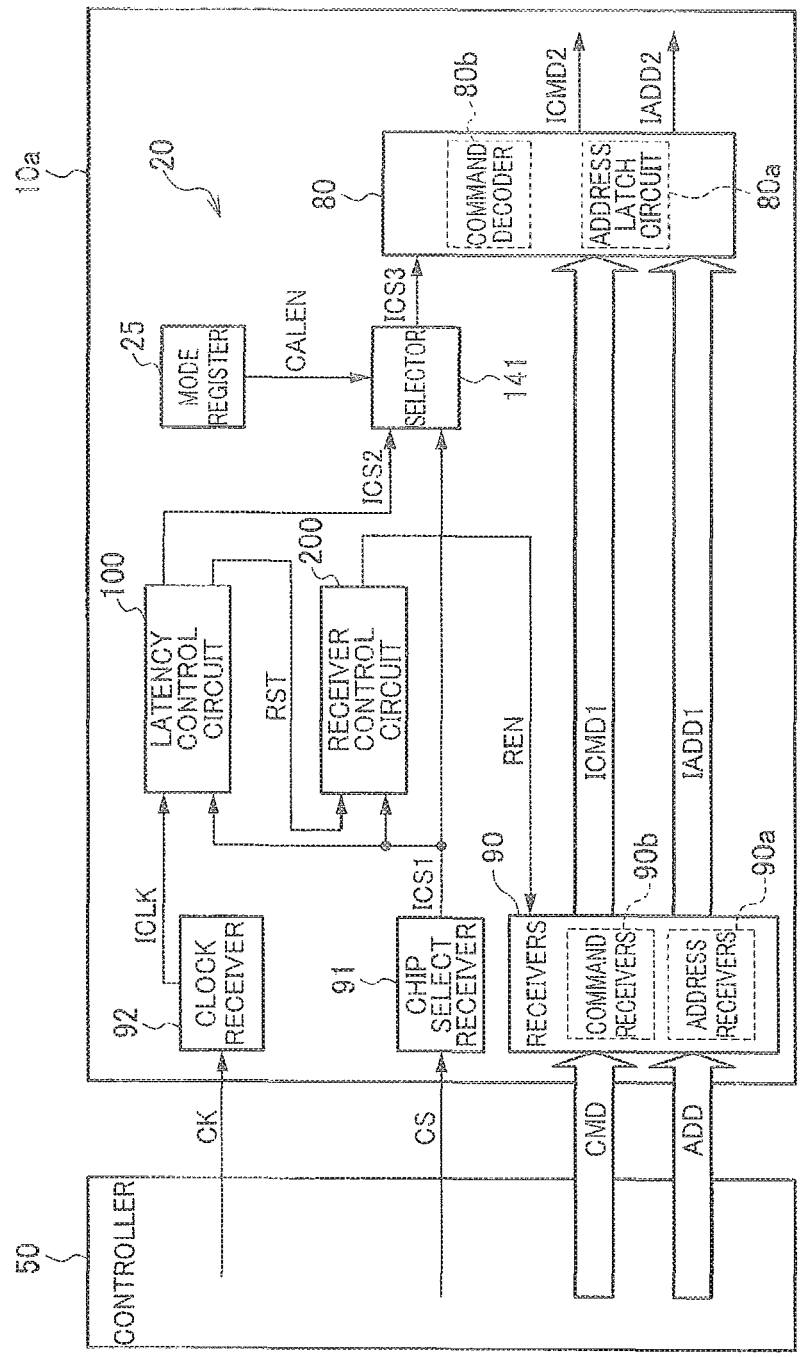
F I G. 2

| CS | CMD | | | | ICMD2 |
|---|---|---|---|---|---|
| | ACT | RAS | CAS | WE | |
| 0 | X | X | X | X | DESEL |
| 1 | 0 | 0 | 0 | 0 | NOP |
| 1 | 1 | 0 | 0 | 0 | IACT |
| 1 | 0 | 1 | 0 | 1 | IPRE |
| 1 | 0 | 0 | 1 | 1 | IWR1 |
| 1 | 0 | 0 | 1 | 0 | IRD1 |
| 1 | 0 | 1 | 1 | 1 | MRS |

FIG.5

SYSTEM, METHOD, AND CONTROLLER FOR SUPPLYING ADDRESS AND COMMAND SIGNALS AFTER A CHIP SELECT SIGNAL

CROSS-REFERENCE TO RELATED APPLICATIONS

The present application is a Continuation Application of U.S. patent application Ser. No. 15/403,513 filed on Jan. 11, 2017, now U.S. Pat. No. 9,886,994 which issued on Feb. 6, 2018, which is a Continuation Application of U.S. patent application Ser. No. 15/229,417 filed on Aug. 5, 2016, now U.S. Pat. No. 9,576,639, which is a Continuation Application of U.S. patent application Ser. No. 14/733,924 filed on Jun. 8, 2015, now U.S. Pat. No. 9,455,019 which issued on Sep 27, 2016, which is a Continuation Application of U.S. patent application Ser. No. 14/268,827 filed on May 2, 2014, now U.S. Pat. No. 9,053,775 which issued on Jun. 9, 2015, which is a Continuation Application of U.S. patent application Ser. No. 13/615,430 filed on Sep. 13, 2012, now U.S. Pat. No. 8,743,652 which issued on Jun. 3, 2014, which is based on and claims priority from Japanese Patent Application No. 2011-212142, filed on Sep. 28, 2011, all of which are incorporated herein by reference in their entirety.

BACKGROUND OF THE INVENTION

Field of the Invention

The present invention relates to a semiconductor device and an information processing system including the same, and more particularly to a semiconductor device that can issue a command signal and the like at timing different from that of a chip select signal and an information processing system including the same.

Description of Related Art

Semiconductor memory devices typified by a dynamic random access memory (DRAM receive an address signal and a command signal supplied from a controller, and access the memory cell array based on the signals. The address signal and the command signal are enabled when a chip select signal supplied from the controller is activated. In principle, the controller therefore needs to issue the address signal and the command signal with the chip select signal activated.

DDR4 (Double Data Rate 4) DRAMs have recently been proposed as DRAMs even faster than DDR3 (Double Data Rate 3) DRAMs. DDR4 DRAMs support a new function called "CS_n to command address latency (CAL latency)". The CAL latency means that the controller supplies an address signal and a command signal to a semiconductor device after a predetermined time (predetermined latency) since the controller supplies a chip select signal to the semiconductor device and the semiconductor device receives the address signal and the command signal after a predetermined time (predetermined latency) since the reception of the chip select signal. That is, the CAL latency is a function that allows input of the address signal and the command signal after a lapse of a predetermined latency since the reception of the chip select signal with respect to the semiconductor device. Such a function can be used to grasp the input timing of the address signal and the command signal on the semiconductor device (semiconductor memory device) side. Address receivers and command receivers can thus be deactivated in periods where the address signal and the command signal are not input. This allows a reduction in power consumption.

A semiconductor device that can issue a command signal and the like at timing different from that of a chip select signal is also described in Japanese Patent Application Laid-Open No. 2000-285674.

What timing to change the address receivers and the command receivers from an inactive state to an active state after a lapse of the CAL latency since the activation of the chip select signal, and what timing to change the receivers from an active state to an inactive state, may be determined in consideration of the CAL latency and power consumption. There are three important factors concerned, including the power consumption of the receivers, the power consumption caused by control signals for controlling the activation and deactivation of the receivers, and the value of the CAL latency.

For example, Japanese Patent Application Laid-Open No. 2000-285674 discusses that an enable signal is activated at timing ½ clock cycles after the activation of a chip select signal, and the enable signal is deactivated at timing one clock cycle later. According to the semiconductor device described in Japanese Patent Application Laid-Open No. 2000-285674, the enable signal has a waveform that changes with the chip select signal. If the chip select signal changes frequently in a short period, the enable signal also changes frequently in a short time. In such a case, the semiconductor device fails to provide a sufficient effect for reducing power consumption including the charging and discharging currents of the enable signal. The reason is that the enable signal, supplied to a large number of address receivers and command receivers, is a high-load internal signal in the semiconductor device.

SUMMARY

In one embodiment, there is provided a semiconductor device having a memory array, the method includes receiving a mode register command to set a command latency value in a mode register; receiving a chip select signal; activating a command receiver in response to the chip select signal; receiving, with the command receiver, an access command with a first latency from the chip select signal equal to the command latency value; accessing the memory array in response to the access command; and deactivating the command receiver with a second latency from the chip select signal equal to a deactivation latency value, In another embodiment, there is provided a semiconductor device that includes: a command receiver receiving a command signal supplied from outside via a command terminal to generate an internal command signal; and a control circuit activating an internal chip select signal after elapse of a first latency since a chip select signal supplied from outside via a chip select terminal is activated. The control circuit activates the command receiver in response to the chip select signal, and deactivates the command receiver when the chip select signal is maintained in an inactive state during a second latency that is larger than the first latency.

In still another embodiment, there is provided an information processing system that includes: a controller that outputs a chip select signal and a command signal; and a semiconductor device. The semiconductor device includes: a command receiver receiving the command signal supplied from the controller to generate an internal command signal; and a control circuit activating an internal chip select signal after elapse of a first latency since the chip select signal supplied from the controller is activated. The control circuit activates the command receiver in response to the chip select signal, and deactivates the command receiver when the chip select signal is maintained in an inactive state during a second latency that is larger than the first latency.

According to the present invention, the active state of the command receiver is maintained even if the chip select signal changes frequently in a short period. This reduces charging and discharging currents resulting from frequent repetitions of activation and deactivation of the command receiver, whereby the power consumption of the semiconductor device can be reduced.

BRIEF DESCRIPTION OF THE DRAWINGS

FIG. 2 is a block diagram indicative of an embodiment of a semiconductor device 10a according to a first preferred embodiment of the present invention and mainly shows details of circuit blocks belonging to an access control circuit 20 shown in FIG. 1;

FIG. 5 is an example of a truth table for explaining an operation of a command decoder 82;

DETAILED DESCRIPTION OF THE EMBODIMENTS

A representative example of the technical concept of an embodiment of the present invention for solving the problem will be described below. It will be understood that what the present invention claims are not limited to such a technical concept but set forth in the claims of the present invention. More specifically, the present embodiment includes: changing a command receiver from an inactive state to an active state in response to the activation of a chip select signal; and changing the command receiver from the active state to the inactive state on the condition that the chip select signal has been maintained in an inactive state for a time (second latency) longer than a CAL latency (first latency). In other words, the active state of the command receiver corresponding to a first chip select signal supplied to the semiconductor device is changed to the inactive state on the condition that a second chip select signal is not supplied (i.e., the chip select signal has been maintained in an inactive state) in a second latency period corresponding to the first chip select signal. Consequently, the active state of the command receiver is maintained even if the chip select signal changes frequently in a short period. This reduces charging and discharging currents resulting from the control of the command receiver.

Figure 1:
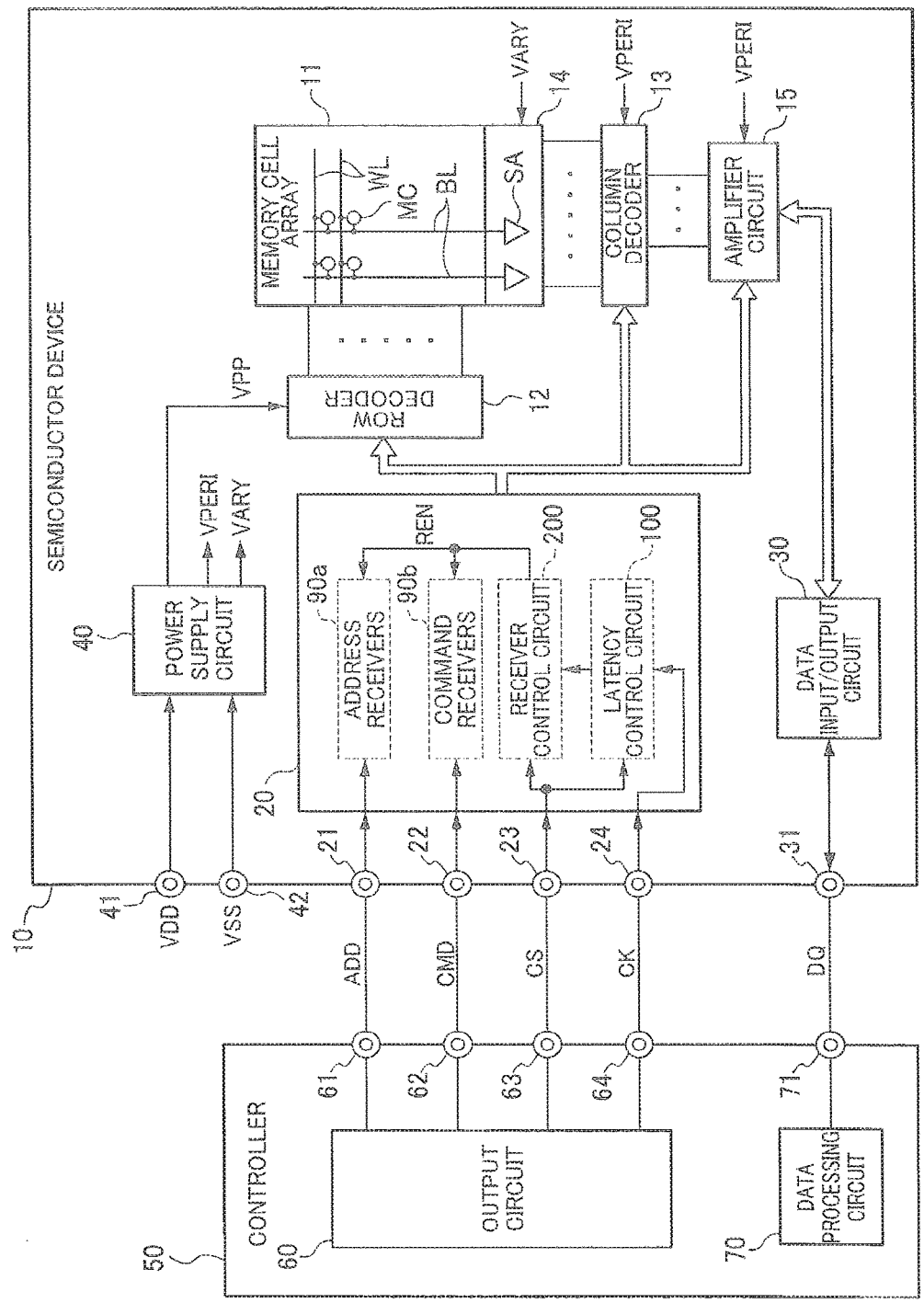
FIG. 1 is a block diagram for explaining the principle of an embodiment of the present invention.

Referring now to FIG. 1, an information processing system including a controller 50 and a semiconductor device 10 is shown. The semiconductor device 10 shown in FIG. 1 is a semiconductor memory device such as a clock synchronization type DRAM. The semiconductor device 10 includes a memory cell array 11. The memory cell array 11 includes a plurality of word lines WL and a plurality of bit lines BL which intersect each other. Memory cells MC are arranged at the intersections. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD, a command signal CMD, a chip select signal CS, and a clock signal CK are supplied to the access control circuit 20 through terminals 21 to 24. Based on such signals, the access control circuit 20 controls the row decoder 12, the column decoder 13, the sense circuit 14. the amplifier circuit 15, and a data input/output circuit 30.

Specifically, if the command signal CMD is an active command, the address signal ADD is supplied to the row decoder 12. In response to this, the row decoder 12 selects a word line WL that is designated by the address signal ADD, whereby corresponding memory cells MC are connected to respective bit lines BL. The access control circuit 20 then activates the sense circuit 14 at predetermined timing.

On the other hand, if the command signal CMD is a read command or a write command, the address signal ADD is supplied to the column decoder 13. In response to this, the column decoder 13 connects bit lines BL designated by the address signal ADD to the amplifier circuit 15. Consequently, in a read operation, read data DQ read from the memory cell array 11 through sense amplifiers SA is output from a data terminal 31 to outside through the amplifier circuit 15 and the data input/output circuit 30. In a write operation, write data DQ supplied from outside through the data terminal 31 and the data input/output circuit 30 is written to memory cells MC through the amplifier circuit 15 and sense amplifiers SA.

As shown in FIG. 1, the access control circuit 20 includes address receivers 90a, command receivers 90b, a latency control circuit, and receiver control circuit 200.

The address receivers 90a are circuits that accept the address signal ADD supplied from the controller 50 through address terminals 21. The address signal ADD includes a plurality of bits. There are a plurality of address terminals 21 and a plurality of address receivers 90a corresponding to the respective plurality of bits. The command receivers 90b are circuits that accept the command signal CMD supplied from the controller 50 through command terminals 22. The command signal CMD includes a plurality of bits. There are a plurality of command terminals 22 and a plurality of command receivers 90b corresponding to the respective plurality of bits. The address receivers 90a and the command receivers 90b are activated based on an enable signal REN. If the enable signal REN is in an inactive state, the address receivers 90a and the command receivers 90b are also deactivated. Thus, power consumption is reduced. In the present embodiment, the enable signal REN may be referred to as a "first control signal".

The latency control circuit 100 is a circuit that receives the chip select signal CS supplied from the controller 50 through the chip select terminal 23 and delays the chip select signal CS by a predetermined latency. The latency control circuit 100 performs delay operations in synchronization with the clock signal CK. The clock signal CK is a synchronization signal having a predetermined period. The clock signal CK is supplied from the controller 50 through the clock terminal 24. The latency control circuit 100 performs two types of delay operations. A first operation includes enabling internal address signals and internal command signals output from the address receivers 90a and the command receivers 90b in response to a lapse of a first latency since the activation of the chip select signal CS. A second operation includes resetting the receiver control circuit 200 in response to the fact that the chip select signal CS has maintained the inactive state for a second latency longer than the first latency after the activation of the chip select signal CS. In the present embodiment, the first latency may be referred to as a "first time".

The receiver control circuit 200 is set in response to the activation of the chip select signal CS. The receiver control circuit 200, when set, activates the enable signal REN. The receiver control circuit 200 is reset in response to a lapse of the foregoing second latency since the activation of the chip select signal CS. The resetting of the receiver control circuit 200 deactivates the enable signal REN.

The foregoing circuit blocks operate with respective predetermined internal voltages as their power supply. The internal power supplies are generated by a power supply circuit 40 shown in FIG. 1. The power supply circuit 40 receives an external potential VDD and a ground potential VSS supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is a voltage that is mainly used in the row decoder 12. The row decoder 12 drives a word line WL that is selected based on the address signal ADD to the VPP level, thereby making the cell transistors included in memory cells MC conducting. The internal voltage VARY is a voltage that is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. The use of the internal voltage VPERI lower than the external voltage VDD as the operating voltage of the peripheral circuits reduces the power consumption of the semiconductor device 10.

Now, the controller 50 includes an output circuit 60 and a data processing circuit 70. The output circuit 60 is a circuit for supplying the address signal ADD, the command signal CMD, the chip select signal CS, and the clock signal CK to the semiconductor device 10 through terminals 61 to 64. The data processing circuit 70 is a circuit that processes read data DQ and write data DQ input/output through a data terminal 71. When the controller 50 accesses the semiconductor device 10, the controller 50 supplies the address signal ADD and the command signal CMD to the semiconductor device 10 after a lapse of a predetermined latency.

Consequently, in a period where neither of the address signal ADD and the command signal CMD is supplied from the controller 50, the address receivers 90a and the command receivers 90b of the semiconductor device 10 are deactivated. This reduces the power consumption of the receivers 90a and 90b. The address receivers 90a and the command receivers 90b are not deactivated immediately after a lapse of the first latency since the activation of the chip select signal CS. Instead, the address receivers 90a and the command receivers 90b are deactivated after a lapse of the second latency longer than the first latency. The receivers 90a and 90b are thus maintained in an active state if the activation and deactivation of the chip select signal CS are frequently repeated in a short period. Consequently, even if the activation and deactivation of the chip select signal CS are frequently repeated in a short period, it is possible to reduce the charging and discharging currents of the high-load enable signal REN due to the control of the receivers 90a and 90b.

Preferred embodiments of the present invention will be explained below in detail with reference to the accompanying drawings.

Turning to FIG. 2, the access control circuit 20 includes a chip select receiver 91 and a clock receiver 92 aside from the address receivers 90a and the command receivers 90b. The chip select receiver 91 receives the chip select signal CS supplied from the controller 50 and generates an internal chip select signal ICS1. The clock receiver 92 receives the clock signal CK supplied from the controller 50 and generates an internal clock signal ICLK. The internal chip select signal ICS1 and the internal clock signal ICLK are supplied to the latency control circuit 100.

Figure 3:
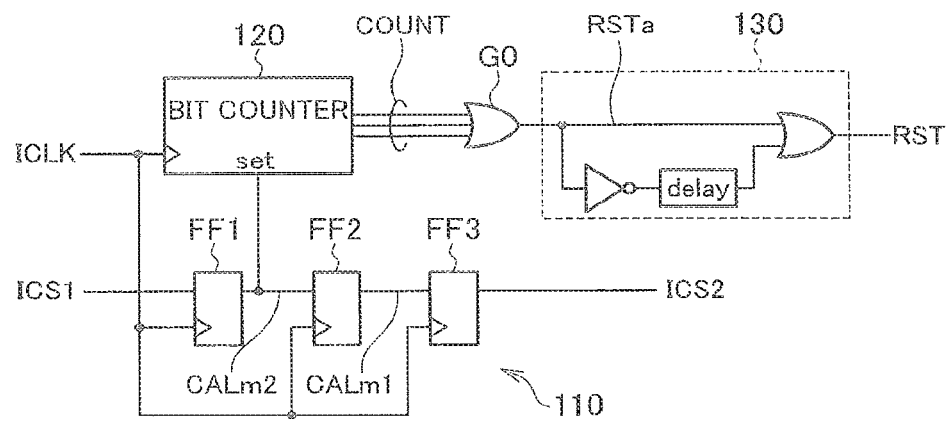
FIG. 3 is a circuit diagram indicative of an embodiment of a latency control circuit 100.

Turning to FIG. 3, the latency control circuit 100 includes a shift register 110 which includes three cascaded stages of flip-flop circuits FF1 to FF3. The internal chip select signal ICS1 is supplied to the flip-flop circuit FF1 in the first stage. An internal chip select signal ICS2 is output from the flip-flop circuit FF3 in the final state. Since the flip-flop circuits FF1 to FF3 operate in synchronization with the internal clock signal ICLK, the shift register 110 outputs the internal chip select signal ICS2 after three clock cycles since the activation of the internal chip select signal ICS1. The number of stages of the shift register 110 corresponds to the foregoing first latency. The internal chip select signal ICS2 is supplied to one of the input nodes of a selector 141 shown in FIG. 2.

While FIG. 3 shows the case where the first latency is three clock cycles, the first latency need not be fixed. It is preferable that the value of the first latency is variable by mode setting. The mode setting is performed by setting a predetermined mode signal into a mode register 25 shown in FIG. 2. The mode register 25 contains set values including one as to whether to enable or disable a CAL latency operation. If an operation mode for enabling a CAL latency operation (CALON mode) is set, a mode signal CALEN is activated to a high level, for example. If an operation mode for disabling a CAL latency operation (CALOFF mode) is set, the mode signal CALEN is deactivated to a low level, for example.

The latency control circuit 100 further includes a bit counter 120. The bit counter 120 is a circuit that performs a count-down operation in synchronization with the internal clock signal ICLK. The resulting count value COUNT is supplied to a detection circuit G0 which is an OR gate circuit. The bit counter 120 includes a set node "set" which is intended to set the count value COUNT to an initial value. When the set node "set" is activated to a high level, the count value COUNT is preset to a maximum value. As shown in FIG. 3, an output signal CALm2 of the flip-flop circuit FF1 is supplied to the set node "set" of the bit counter 120. This means that the bit counter 120 is preset to the maximum value after one clock cycle since the activation of the internal chip select signal ICS1.

The detection circuit G0 is a circuit that detects that the count value COUNT of the bit counter 120 reaches a minimum value. In the present example, the count value COUNT is a three-bit binary signal. Counting down the count value COUNT seven times from a maximum value of "111 (=7)" reaches a minimum value of "000 (=0)". In other words, an output signal RSTa of the detection circuit G0 is activated to a low level after a lapse of a total of eight clock cycles since the activation of the internal chip select signal ICS1. Note that if the internal chip select signal ICS1 is activated again within eight clock cycles since the previous activation of the internal chip select signal ICS1, the count value COUNT returns to the maximum value. The output signal RSTa is thus activated to a low level on the condition that the internal chip select signal ICS1 has riot been activated for eight consecutive clock cycles since the last activation of the internal chip select signal ICS1. The number of clocks corresponds to the foregoing second latency. In the present embodiment, the second latency (the time between when the chip select signal CS is deactivated and when the enable signal REN is deactivated to a low level) may be referred to as a "second time".

While FIG. 3 shows the case where the second latency is eight clock cycles, the present invention is not limited thereto. Note that the second latency at least needs to be longer than the first latency. The reason is that if the second latency is shorter than the first latency, the receivers 90a and 90b can be deactivated at timing when the address signal ADD or the command signal CMD is input.

The output signal RSTa of the detection circuit GO is supplied to a pulse generation circuit 130. The pulse generation circuit 130 is a circuit that activates a reset signal RST, a one-shot pulse, in response to a change of the output signal RSTa of the detection circuit GO from a high level to a low level. In the present embodiment, the reset signal RST may be referred to as a "second control signal", The second control signal is supplied to the receiver control circuit 200 shown FIG. 2.

Figure 4:
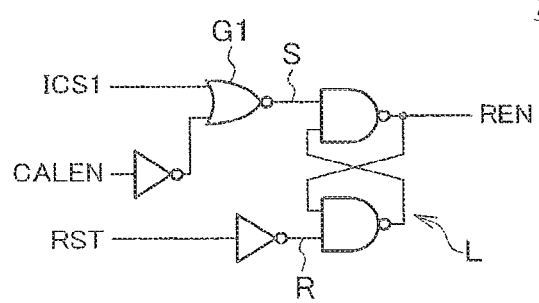
FIG. 4 is a circuit diagram indicative of an embodiment of a receiver control circuit 200.

Turning to FIG. 4, the receiver control circuit 200 includes an SR latch circuit L. A NOR gate circuit G1 receives the inverted signal of the mode signal CALEN and the internal chip select signal ICS1. The output of the NOR gate circuit G1 is supplied to a set node S of the SR latch circuit L. The inverted signal of the reset signal RST is supplied to a reset node R of the SR latch circuit L. With such a configuration, if the mode signal CALEN is activated to a high level, i.e., set to the CALON mode and the internal chip select signal ICS1 is activated, then the enable signal REN is immediately activated to a high level. In the present embodiment, the time between when the chip select signal CS is activated and when the enable signal REN is activated to a high level may be referred to as a "third time". Subsequently, when the reset signal RST is activated, the enable signal REN is deactivated to a low level. The activation timing of the reset signal RST is as has been described with reference to FIG. 3. On the other hand, if the mode signal CALEN is deactivated to a low level, i.e., set to the CALOFF mode, the enable signal REN is constantly activated to a high level.

The enable signal REN is supplied to a receiver 90 shown in FIG. 2. The receiver 90 is a circuit block including the address receivers 90a and the command receivers 90b. The receiver 90 is activated in a period when the enable signal REN is at a high level, and deactivated when the enable signal REN is at a low level. In the meantime, the chip select receiver 91 which receives the chip select signal CS is constantly activated.

As shown in FIG. 2, the internal chip select signal ICS1 and the internal chip select signal ICS2 passed through the latency control circuit 100 are supplied to the selector 141. The selector 141 selects either one of the internal chip select signals ICS1 and ICS2 based on the mode signal CALEN, and supplies the selected signal to a circuit block 80 as an internal chip select signal ICS3. Specifically, if the mode signal CALEN is deactivated to a low level, i.e., set to the CALOFF mode, the selector 141 selects the internal chip select signal ICS1. If the mode signal CALEN is activated to a high level, i.e., set to the CALON mode, the selector 141 selects the internal chip select signal ICS2.

The circuit block 80 includes an address latch circuit 80a and a command decoder 80b. If the internal chip select signal ICS3 is activated, the circuit block 80 enables an internal address signal IADD1 and an internal command signal ICMD1. The internal address signal IADD1 refers to the output signals of the address receivers 90a. The internal command signal ICMD1 refers to the output signals of the command receivers 90b.

If the internal chip select signal ICS3 is activated, the address latch circuit 80a latches the internal address signal IADD1 output from the address receivers 90a, and outputs the latched signal as an internal address signal IADD2. If the internal chip select signal ICS3 is activated, the command decoder circuit 80b decodes the internal command signal ICMD1 output from the command receivers 90b, and outputs the resultant as an internal command signal ICMD2. The internal address signal IADD2 latched in the address latch circuit 80a is supplied to the row decoder 12, the column decoder 13, the mode register 25, and the like according to the content of the internal command signal ICMD2.

Turning to FIG. 5, in this example, combinations of the chip select signal CS and the command signal CMD produce internal commands including a DESEL command, a NOP command, an active command TACT, a precharge command IPRE, a write command IWR1, a read command IRD1, and a mode register setting command MRS.

The DESEL, command is a command that is generated when the chip select signal CS is in an inactive state. When the DESEL command is issued, the access control circuit 20 stops recognition of internal commands generated by combinations of command signals CMD other than the DESEL command. In other words, the generation of new internal commands other than the DESEL command is prevented. The access control circuit 20 therefore issues no new command (new control) to the subsequent circuits (such as the row decoder 12). Consequently, the subsequent circuits maintain their state corresponding to the previous command. The NOP command is a command that is generated when the chip select signal CS is in an active state and all the bits (ACT, RAS, CAS, and WE) of the command signal CMD are at a low level. Again, when the NOP command is issued, the access control circuit 20 issues no new command (new control) to the subsequent circuits (such as the row decoder 12). Consequently, the subsequent circuits maintain their state corresponding to the previous command. As can be seen from FIG. 5, the DESEL command is a broader command than the NOP command.

When the active command IACT, the write command IWR1, and the read command IRD1 are issued, the access control circuit 20 performs the foregoing operations to make a row access, a write access, and a read access, respectively. The precharge command IPRE is a command for deactivating the memory cell array 11 which has been activated by the active command IACT. The mode register setting signal MRS is an internal command for rewriting a set value of the mode register 25.

The configuration of the semiconductor device 10a according to the first embodiment has been described so far. Next, the operation of the semiconductor device 10a according to the present embodiment will be described.

Figure 6:
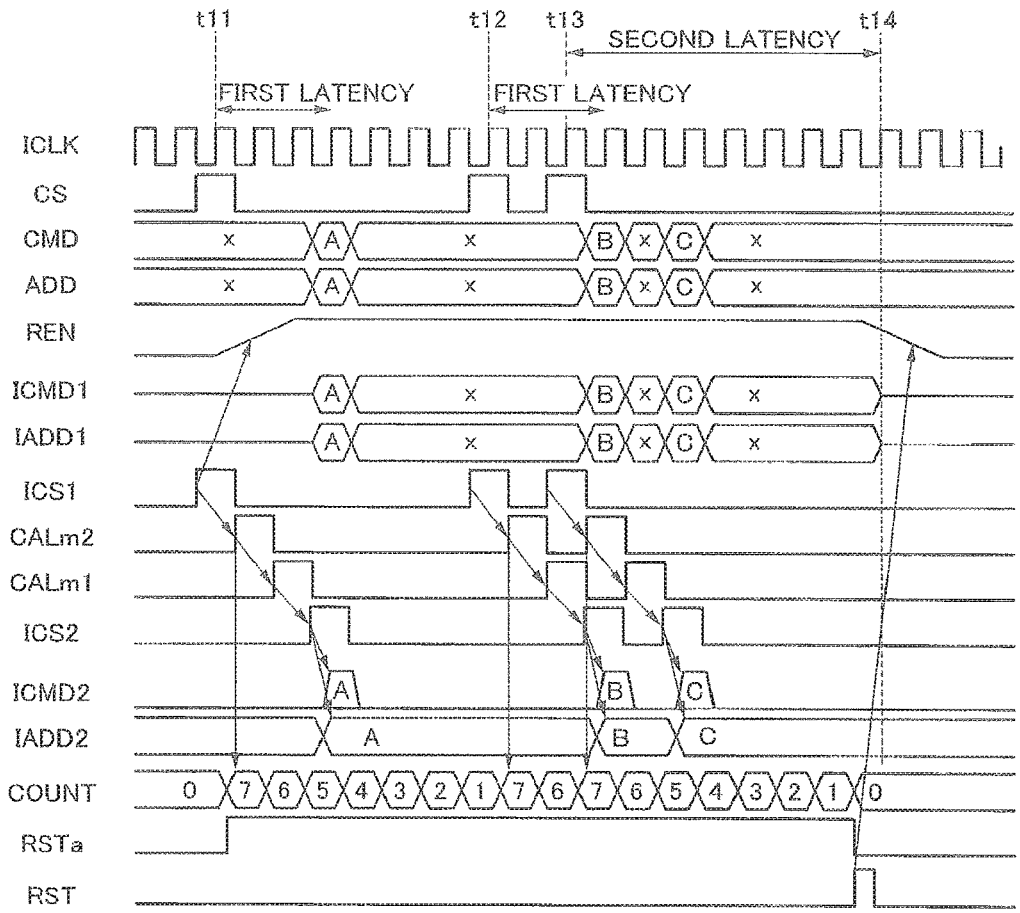
FIG. 6 is a timing chart for explaining the operation of the semiconductor device 10a according to the first embodiment and shows operations in a CALON mode.

Turning to FIG. 6, when the CALON mode is set, the issuance timing of the chip select signal CS from the controller 50 is not the same as that of the command signal CMD and the address signal ADD. The command signal CMD and the address signal ADD are issued after a lapse of the first latency since the issuance of the chip select signal CS. FIG. 6 shows a case where the first latency is set to three clock cycles.

As shown in FIG. 6, when the chip select signal CS is issued at time t11, the internal chip select signal ICS1 changes to a high level and the enable signal REN is activated to a high level. Consequently, the address receivers 90a and the command receivers 90b which have been deactivated are activated to allow the reception of the address signal ADD and the command signal CMD. Note that it takes some time to change the input stages of the receivers 90a and 90b from an inactive state to an active state. In FIG. 6, the gentle change of the enable signal REN represents the time needed. The number of input stages included in the receivers 90a and 90b is approximately twenty, the same as the number of address terminals 21 and command terminals 22. To switch the input stages from an OFF state to an ON state, all the gate electrodes included in the circuits need to be charged up. This produces relatively high charging and discharging currents. In other words, a considerable amount of power is consumed to switch the receivers 90a and 90b from an inactive state to an active state and from an active state to an inactive state.

The internal chip select signal ICS1 is passed through the flip-flop circuits FF1 to FF3 included in the latency control circuit 100 and output as the internal chip select signal ICS2 three clock cycles later. The activation timing of the internal chip select signal ICS2 is in synchronization with the timing when the command signal CMD and the address signal ADD are issued from the controller 50. As a result, the command signal CMD and the address signal ADD are processed by the address latch circuit 80a and the command decoder 80b. In FIG. 6, the command and address corresponding to time t11 are denoted by A.

Now, when the output signal CALm2 of the flip-flop circuit FF1 is activated, the count value COUNT of the bit counter 120 is preset to the maximum value=7. The count value COUNT of the bit counter 120 is counted down in synchronization with the internal clock signal ICLK. In the example shown in FIG. 6, the chip select signal CS is activated again at time t12 before the count value COUNT of the bit counter 120 reaches 0. Time t12 is the timing where seven clock cycles have elapsed since time t11. Since the count value COUNT of the bit counter 120 is restored to the maximum value=7 before reaching 0, the reset signal RST is not activated at this point in time.

In the example shown in FIG. 6, the chip select signal CS is also activated at time t13 which is two clock cycles after time t12. Operations based on the chip select signals CS input at times t12 and t13 are the same as those based on the chip select signal CS input at time M. Consequently, the enable signal REN remains at a high level during that time, allowing the reception of the address signal ADD and the command signal CMD. In FIG. 6, the commands and addresses corresponding to times t12 and t13 are denoted by B and C, respectively.

After a lapse of eight clock cycles since time t13, the count value COUNT of the bit counter 120 reaches 0, whereby the reset signal RST is activated. In response to this, the SR latch circuit L included in the receiver control circuit 200 is reset, and the enable signal REN is deactivated to a low level. At this point in time, it is assured that the chip select signal CS has not been activated for at least eight clock cycles. Then, no address signal ADD or command signal CMD will be supplied from the controller 50.

As described above, the semiconductor device 10a according to the present embodiment does not deactivate the address receivers 90a or the command receivers 90b immediately after a lapse of the first latency since the activation of the chip select signal CS. Instead, the semiconductor device 10a deactivates the address receivers 90a and the command receivers 90b after a lapse of the second latency longer than the first latency. The receivers 90a and 90b are therefore maintained in an active state if the activation and deactivation of the chip select signal CS are frequently repeated in a short period. This can reduce charging and discharging currents resulting from the control of the receivers 90a and 90b. Note that the address receivers 90a and the command receivers 90b are activated immediately after the activation of the chip select signal CS, without waiting for the first latency to elapse. The address signal ADD and the command signal CMD can thus be properly received even if it takes time to activate the receivers 90a and 90b.

Next, a second embodiment of the present invention will be described.

Figure 7:
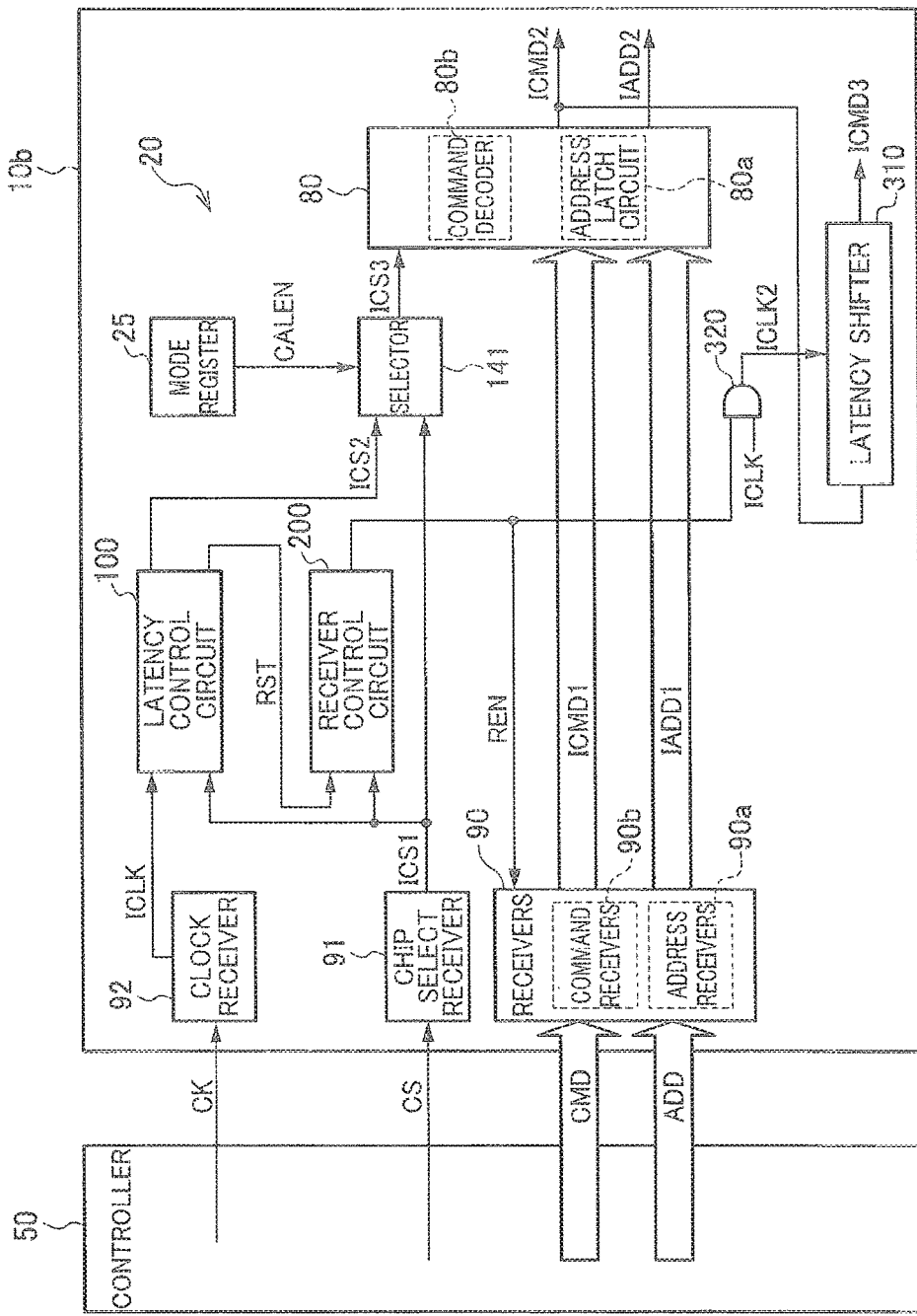
FIG. 7 is a block diagram indicative of an embodiment of a semiconductor device 10b according to a second preferred embodiment of the present invention and mainly shows details of circuit blocks belonging to the access control circuit 20 shown in FIG. 1.

Turning to FIG. 7, the second embodiment differs from the semiconductor device 10a shown in FIG. 2 in that there are added a latency shifter 310 and an AND gate circuit or synchronization control circuit 320. In other respects, the present embodiment is the same as the semiconductor device 10a shown in FIG. 2. The same components will thus be designated by like reference numerals. Redundant description will be omitted.

The latency shifter 310 is a counter that counts the latency of a column system command (such as a write command and a read command) included in the internal command signal ICMD2 generated by the command decoder 80b. Receiving a column-system internal command signal ICMD2, the latency shifter 310 counts up a predetermined latency and then outputs the column-system internal command signal ICMD2 as an internal command signal ICMD3. Latencies for the latency shifter 310 to count include the latency of a write command, or a write latency WL, and the latency of a read command, or a read latency RL.

The write latency WL refers to the latency from the issuance of a write command from the controller 50 to the input of the first piece of write data DQ. Issuance timing of a write command may be preceded by an additive latency (AL) than its original issuance timing. The write latency WL is thus defined by WL=AL+CWL, where a latency from the original issuance timing of a write command to the input of the first piece of write data DQ is the CAS write latency (CWL).

The read latency refers to the latency from the issuance of a read command from the controller 50 to the output of the first piece of read data DQ. Issuance timing of a read command may be preceded by an additive latency (AL) than its original issuance timing. The read latency RL is thus defined by RL=AL+CL, where a latency from the original issuance timing of a read command to the output of the first piece of read data DQ is the CAS latency (CL). The controller 50 issues the write latency WL, the read latency RL, and the additive latency AL to the semiconductor device 10b in advance. The semiconductor device 10b stores the values of the write latency WL, the read latency RL, and the additive latency AL into the mode register 25 shown in FIG. 2.

The latency shifter 310 operates in synchronization with an internal clock signal ICLK2 output from the synchronization control circuit 320. The synchronization control circuit 320 is a two-input AND gate circuit that receives the internal clock signal ICLK and the enable signal REN. The synchronization control circuit 320 is thus clocked only in a period where the enable signal REN is at a high level. In the present embodiment, the second latency is set to be longer than the write latency WL and the read latency RL.

Figure 8:
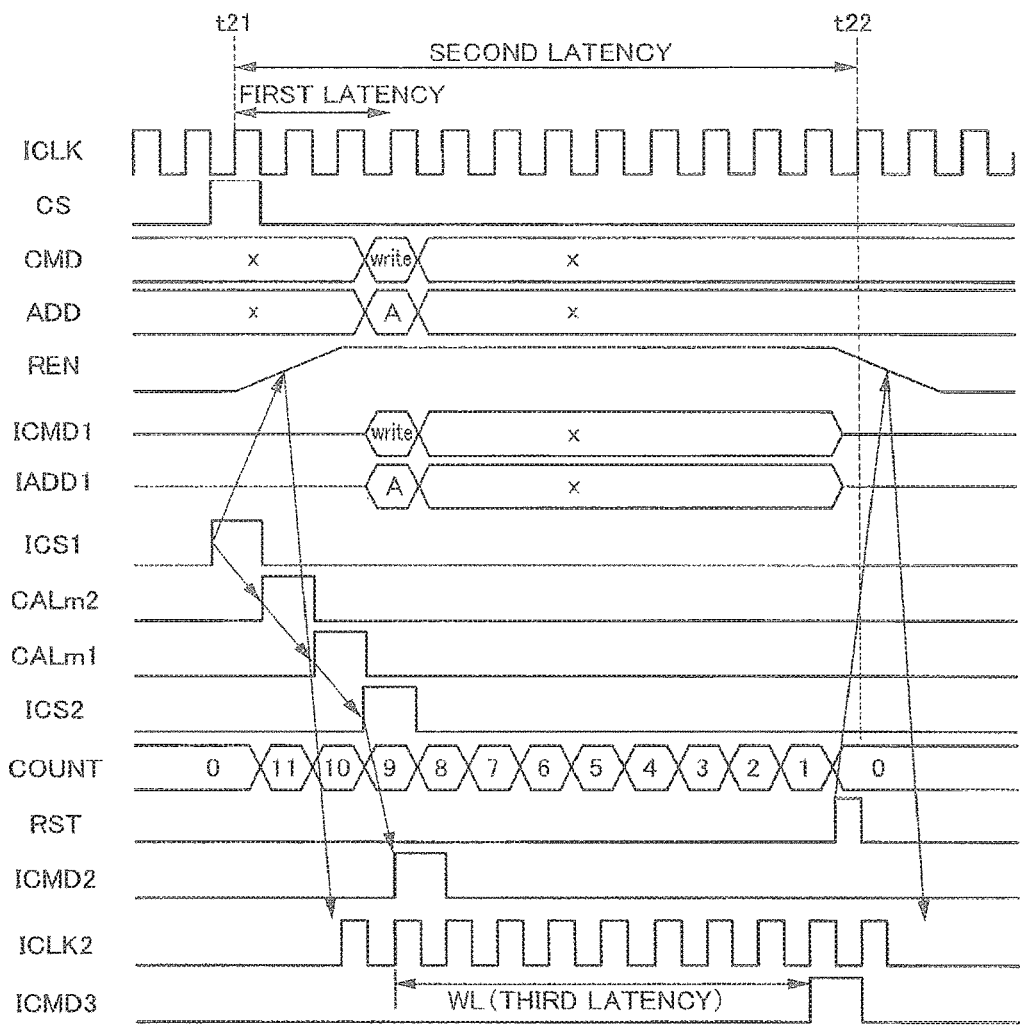
FIG. 8 is a timing chart for explaining the operation of the semiconductor device 10b according to the second embodiment and shows operations in a CALON mode.

Turning to FIG. 8, in the present example, the count value COUNT of the bit counter 120 is preset to a maximum value of 11.

As shown in FIG. 8, when the chip select signal CS is issued at time t21, the internal chip select signal ICS1 changes to a high level and the enable signal REN is activated to a high level. Consequently, the address receivers 90*a* and the command receivers 90*b* which have been deactivated are activated to allow the reception of the address signal ADD and the command signal CMD. Such an operation is the same as in the first embodiment.

When the enable signal REN is activated to a high level, the internal clock signal ICLK2 starts clocking. The clocking of the internal clock signal ICLK2 makes the latency shifter 310 operable. After a lapse of three clock cycles since the activation of the chip select signal CS, the controller 50 issues the command signal CMD and the address signal ADD. The present example deals with the case where the command signal CMD issued from the controller 50 is a write command. Such a command signal CMD is accepted by the command receivers 90*b*, and decoded into the internal command signal ICMD2 by the command decoder 80*b*. The internal command signal ICMD2 is input to the latency shifter 310.

At this point in time, the latency shifter 310 is in an operable state. The latency shifter 310 therefore provides a delay as much as the write latency WL to the internal command signal ICMD2 input to the latency shifter 310, and outputs the resultant as the internal command signal ICMD3. In the present embodiment, the latency that represents a write latency WL and a read latency RL for the latency shifter 310 to provide may be referred to as a "third latency".

After a lapse of twelve clock cycles since time t21, the count value COUNT of the bit counter 120 reaches 0, whereby the enable signal REN is deactivated to a low level (time t22). In response to this, the internal clock signal ICLK2 stops clocking. At this point in time, the chip select signal CS has not been activated for at least twelve clock cycles. This ensures that no command is retained in the latency shifter 310. The reason is that the second latency is set to be longer than the write latency WL and the read latency RL.

Incidentally, the entire contents disclosed in the aforementioned patent documents and non-patent documents including Japanese Patent Application Laid-Open No. 2000-285674 are incorporated herein by reference.

As described above, the semiconductor device 10*b* according to the second embodiment stops clocking the internal clock signal ICLK2 in a period where the enable signal REN is in an inactive state. Consequently, useless clocking is avoided in a period where no command is retained in the latency shifter 310. This allows a further reduction of power consumption in addition to the effects of the first embodiment.

It is apparent that the present invention is not limited to the above embodiments, but may be modified and changed without departing from the scope and spirit of the invention.

Volatile memories, non-volatile memories, or mixtures of them can be applied to the memory cells of the present invention.

The technical concept of the present invention may be applied to a semiconductor device including a signal transmission circuit. The forms of the circuits in the circuit blocks disclosed in the drawings and other circuits for generating the control signals are not limited to the circuit forms disclosed in the embodiments.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors that constitute a logic gate and the like are field effect transistors (FETs), various FETs are applicable, including MIS (Metal Insulator Semiconductor) and TFT (Thin Film Transistor) as well as NMS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needless to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following information processing systems:

A1. An information processing system comprising:
    a controller that outputs a chip select signal and a command signal; and
    a semiconductor device including:
        a command receiver receiving the command signal supplied from the controller to generate an internal command signal; and
        a control circuit activating an internal chip select signal after elapse of a first latency since the chip select signal supplied from the controller is activated,
    wherein the control circuit activates the command receiver in response to the chip select signal, and deactivates the command receiver when the chip select signal is maintained in an inactive state during a second latency that is larger than the first latency.

A2. The information processing system as described in A1, wherein the semiconductor device further includes:
a command decoder that decodes the internal command signal to generate a first internal command signal; and
a selector that supplies either one of the chip select signal and the internal chip select signal to the command decoder to activate the command decoder.

A3. The information processing system as described in A1 or A2, wherein
the semiconductor device further includes an address receiver receiving an address signal supplied from the controller to generate an internal address signal,
the control circuit activates the address receiver in response to the chip select signal, and deactivates the address receiver when the chip select signal is maintained in the inactive state during the second latency.

What is claimed is:

1. A controller for controlling operation of a memory device, the controller comprising:
an output circuit configured to:
supply a chip select signal, an address signal, a command signal, and a clock signal to the memory device; and
a data processing circuit configured to process read data and write data through a data terminal based on the chip select signal, the address signal, the command signal, and the clock signal supplied by the output circuit;
wherein the controller is configured to supply the address signal and the command signal to the memory device a predetermined duration after the output circuit supplies the chip select signal.

2. The controller of claim 1, wherein the memory device is a DRAM.

3. The controller of claim 1, wherein the controller is configured to set a mode register with an enable setting that corresponds to the predetermined duration.

4. The controller of claim 3, wherein the controller is configured to set the mode register with a predetermined latency.

5. The controller of claim 1, wherein, in response to the output circuit supplying the chip select signal, a command receiver and an address receiver change from an inactive state to an active state.

6. The controller of claim 5, wherein, in response to the output circuit supplying the chip select signal, the command receiver and the address receiver change from the inactive state to the active state a predetermined time after the output circuit supplies the chip select signal.

7. The controller of claim 6, wherein, in response to the output circuit supplying the chip select signal and the command receiver changing to the active state, the command receiver receives the command signal and produces an internal command signal.

8. The controller of claim 7, wherein, in response to the output circuit supplying the chip select signal and the address receiver changing to the active state, the address receiver receives the address signal and produces an internal address signal.

9. A system comprising:
a controller; and
a memory device;
wherein the controller comprises:
an output circuit configured to supply a chip select signal, an address signal, a command signal, and a clock signal to the memory device; and
a data processing circuit configured to process read data and write data through a data terminal based on the chip select signal, the address signal, the command signal, and the clock signal supplied by the output circuit;
wherein the controller is configured to supply the address signal and the command signal to the memory device a predetermined duration after the output circuit supplies the chip select signal.

10. The system of claim 9, further comprising a mode register, wherein the controller is configured to set the mode register with an enable setting that corresponds to the predetermined duration.

11. The system of claim 10, wherein the controller is configured to set the mode register with a predetermined latency.

12. The system of claim 9, further comprising a command receiver and an address receiver that change from an inactive state to an active state in response to the output circuit supplying the chip select signal.

13. The system of claim 12, wherein the command receiver and the address receiver change from the inactive state to the active state a predetermined time after the output circuit supplies the chip select signal.

14. The system of claim 13, wherein the command receiver receives the command signal and produces an internal command signal in response to the output circuit supplying the chip select signal and the command receiver changing to the active state.

15. The system of claim 14, wherein the address receiver receives the address signal and produces an internal address signal in response to the output circuit supplying the chip select signal and the address receiver changing to the active state.

16. The system of claim 15, further comprising a latency control circuit that signals to a receiver control circuit that the predetermined time has lapsed, and the receiver control circuit activates an enable signal that changes the command receiver and the address receiver from the inactive state to the active state.

17. The system of claim 9, wherein the memory device is a DRAM.

18. A method for controlling operation of a memory device, the method comprising:
supplying a chip select signal, an address signal, a command signal, and a clock signal from an output circuit to the memory device;
processing, by a data processing circuit, read data and write data through a data terminal based on the chip select signal, the address signal, the command signal, and the clock signal supplied by the output circuit; and
supplying the address signal and the command signal to the memory device a predetermined duration after the output circuit supplies the chip select signal.

19. The method of claim 18, further comprising setting a mode register with an enable setting that corresponds to the predetermined duration.

20. The method of claim 19, further comprising setting the mode register with a predetermined latency.

* * * * *